United States Patent
Yueh

(10) Patent No.: US 8,290,184 B2
(45) Date of Patent: Oct. 16, 2012

(54) MEMS MICROPHONE

(76) Inventor: Fan-En Yueh, New Taipei (TW)

( * ) Notice: Subject to any disclaimer, the term of this patent is extended or adjusted under 35 U.S.C. 154(b) by 0 days.

(21) Appl. No.: 13/025,332

(22) Filed: Feb. 11, 2011

(65) Prior Publication Data

US 2012/0205755 A1   Aug. 16, 2012

(51) Int. Cl.
*H04R 19/04*   (2006.01)
(52) U.S. Cl. ........ 381/174; 381/122; 381/173; 381/355; 381/369
(58) Field of Classification Search .................. 381/174, 381/173, 122, 355, 369
See application file for complete search history.

(56) References Cited

U.S. PATENT DOCUMENTS
2010/0284553 A1*   11/2010   Conti et al. .................... 381/174
* cited by examiner

*Primary Examiner* — Minchul Yang
(74) *Attorney, Agent, or Firm* — Rosenberg, Klein & Lee

(57) ABSTRACT

A MEMS microphone has a cover, a base and a MEMS chip. The cover has a contact voice receiving unit which is disposed on the base, and a space is formed between the cover and the base. The MEMS chip is disposed in the space and electrically connected to the base and the contact voice receiving unit. The MEMS microphone enhances the quality of voice transmission by reducing interferences from ambient noises.

12 Claims, 6 Drawing Sheets

MEMS MICROPHONE

BACKGROUND OF THE INVENTION

1. Field of the Invention

The instant disclosure relates to a Micro Electro Mechanical System (MEMS) structure; in particular, a MEMS microphone.

2. Description of Related Art

The applications of microphone are comprehensive; e.g., hearing aids, electronic ears, cellular phones, digital cameras, hand-free telephone handsets, notebook computers and the like. With advancements in various manufacturing methodologies and packaging techniques, it is currently possible to apply semiconductor processes to fabricate the chip-based microphone, also referred as the MEMS microphone, thereby fulfilling the requirements of features like slim size, power-saving, and low manufacturing cost.

Refer initially to FIG. 1, wherein a cross-sectional view of a conventional MEMS microphone is shown. The conventional MEMS microphone 1 as depicted can be essentially characterized in that a circuit (not shown) and an MEMS chip 11 are installed on a base 10 in which the MEMS chip 11 is wire bonded to the circuit on the base 10, and a cover 13 used to cover the MEMS chip 11 is also installed on the base 10. An air chamber 14 is formed in the space between the MEMS chip 11 and the base 10 as a cavity for voice resonance. Voice enters through a voice hole 15 within the cover 13 and generates vibrations with the membrane located on the MEMS chip 11, thus converting the vibration signal into the electronic signal by the MEMS chip 11.

However, in use of such a conventional MEMS microphone, it may pick up not only the user's voices but ambient sounds as well. Therefore, when a user is communicating by means of a cellular phone (not shown) equipped with such a conventional MEMS microphone in a relatively brawling environment, the receiving party may be seriously interfered by noises and not able to clearly hear the user's voices, thus undesirably affecting their dialogs.

SUMMARY OF THE INVENTION

Accordingly, the objective of the instant disclosure is to provide a MEMS microphone which takes the user's voices via skin contact, thereby preventing the receiving party from being interfered by noises and not able to clearly hear the user's voices.

The instant disclosure exemplarily provides the following embodiments of the MEMS microphone; wherein, a first embodiment of the MEMS microphone comprises a cover, a base, and a MEMS chip. The cover has a contact voice receiving unit allowed for making physical contact. The cover is disposed on the base, and a space is formed between the cover and the base. The MEMS chip is disposed in the space and electrically connected to the base and the contact voice receiving unit.

A second embodiment of the MEMS microphone comprises a cover, a base, a first MEMS chip, and a second MEMS chip. The cover has a contact voice receiving unit allowed for making physical contact. The cover is disposed on the base, and a space is formed between the cover and the base. Also, the base has a voice receiving channel in which one end of the voice receiving channel is connected to the space while the second end thereof is open to the ambient environment. The first MEMS chip is disposed in the space and electrically connected to the base in corresponding to the first end of the voice receiving channel. The second MEMS chip is also disposed in the space and electrically connected to the base and the contact voice receiving unit.

A third embodiment of the MEMS microphone comprises a cover, a base, a first MEMS chip, and a second MEMS chip. The cover has a contact voice receiving unit allowed for making physical contact. The cover is disposed on the base, and a space is formed between the cover and the base. Also, the base has a voice receiving channel in which one end of the voice receiving channel is connected to the space while the second end thereof is open to the ambient environment. The first MEMS chip is disposed in the space and electrically connected to the base in corresponding to the first end of the voice receiving channel. Using the flip chip method, the second MEMS chip is disposed onto the first MEMS chip and electrically connected to the first MEMS chip and the contact voice receiving unit.

A fourth embodiment of the MEMS microphone is provided in which the difference between the fourth embodiment and the second embodiment mainly lies in that: the cover further has a voice hole and the voice hole connects the second end of the voice receiving channel to the ambient.

Similarly, a fifth embodiment of the MEMS microphone is provided in which the difference between the fifth embodiment and the third embodiment mainly lies in that: the cover further has a voice hole, and the voice hole connects the second end of the voice receiving channel to the ambient.

In summary of the aforementioned descriptions, it can be appreciated that the MEMS microphone according to the embodiments of the instant disclosure uses a contact voice receiving unit to make contact with the ambient environment (e.g., in contact with a user's skin). In this way, the MEMS microphone of the embodiments can take the vibration signal generated by the skin when the user speaks, convert the received vibration signal into the electronic signal by means of the MEMS chip and send out the electronic signal through the base, thereby accurately transferring the user's voices and dialogs to the receiving party without interferences caused by ambient noises.

DETAILED DESCRIPTION OF THE PREFERRED EMBODIMENTS

Figure 1:
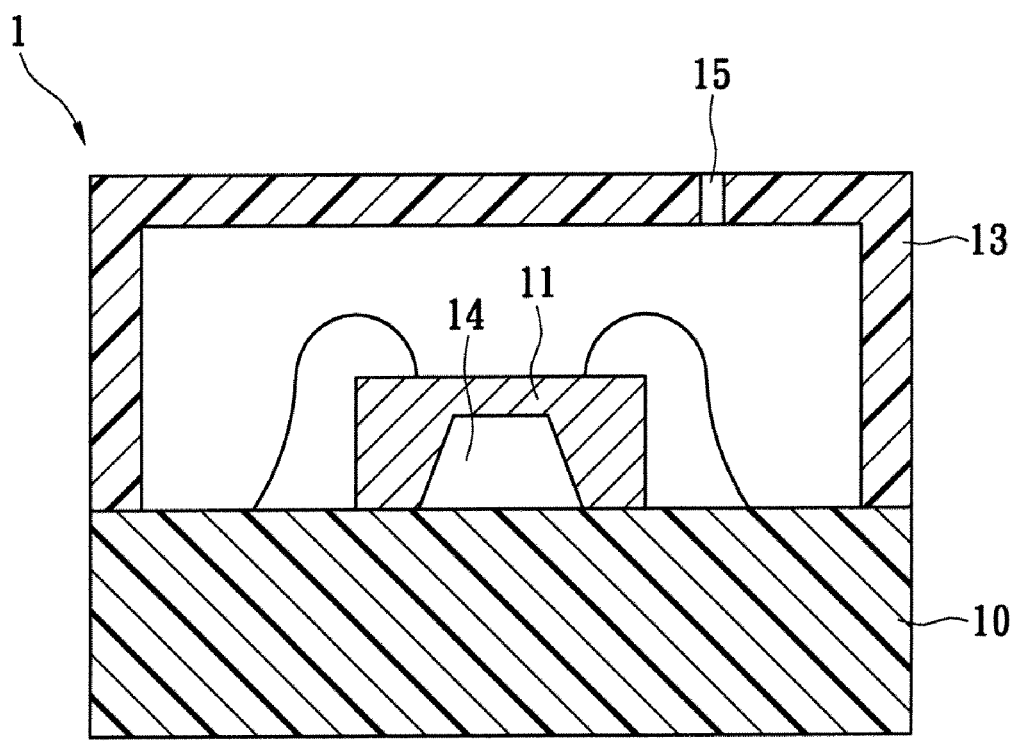
FIG. 1 shows a cross-sectional view of a conventional MEMS microphone.
Figure 2:
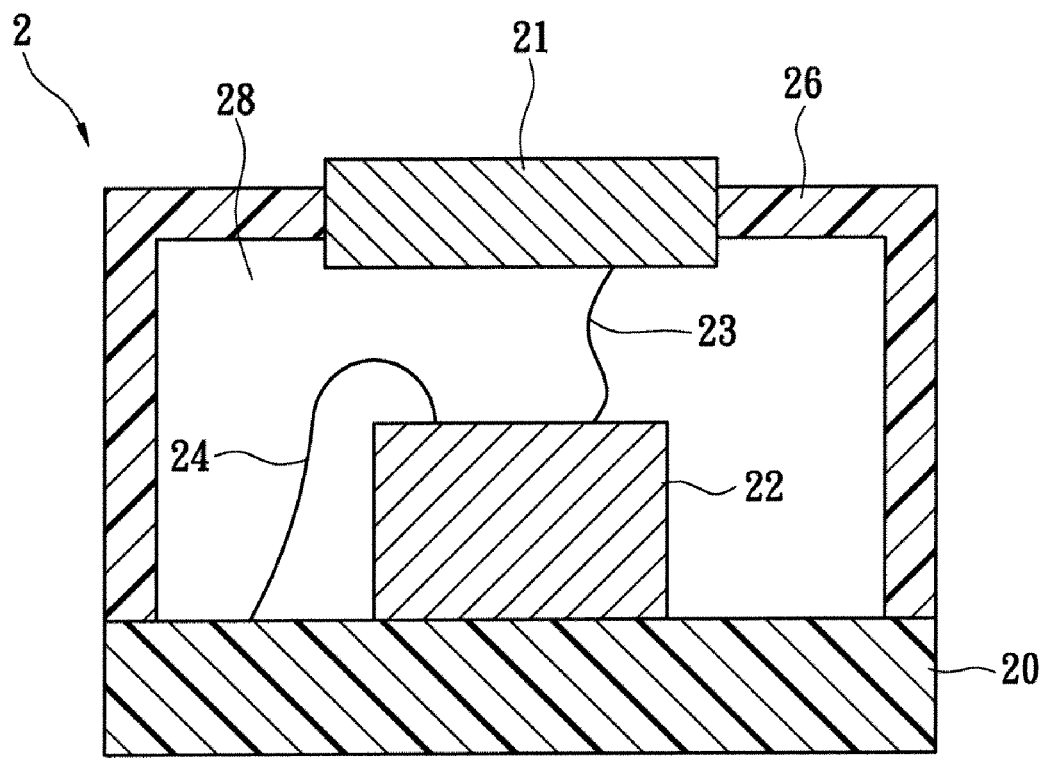
FIG. 2 shows a cross-sectional view of a MEMS microphone for the first embodiment of the instant disclosure.

Refer now to FIG. 2, wherein a cross-sectional view of a MEMS microphone 2 for the first embodiment of the instant disclosure is shown. The MEMS microphone 2 comprises a cover 26, a base 20, and a MEMS chip 22.

A contact voice receiving unit 21 is disposed on the cover 26 for making physical contact. The top side of the base 20 is connected to the cover 26 such that a space 28 is formed between the base 20 and the cover 26. The MEMS chip 22 is disposed within the space 28 and electrically connected to the base 20 and the contact voice receiving unit 21. In the present embodiment, the MEMS chip 22 is electrically connected to the base 20 via a metal conductive line 24 and electrically connected to the contact voice receiving unit 21 through another metal conductive line 23.

Refer again to FIG. 2. The connection of the base 20 and the cover 26 can be done by using an adhesive to bond the cover 26 onto the base 20 along the outer periphery on the top side of the base 20, to encapsulate the MEMS chip 22 within the space 28. Meanwhile, in the present embodiment, the contact voice receiving unit 21 is a voice receiving membrane, which is used to contact human skin as well as to sense and receive by way of human skin the vibration signal generated as the person speaks, and then take and transfer the received vibration signal to the MEMS chip 22. The MEMS chip 22 converts the vibration signal into the electronic signal and sends out the electronic signal. Hence, seeing that the contact voice receiving unit 21 applied in the MEMS microphone 2 according to the present embodiment operates in a contact-sense voice receiving approach, it can be free from the interference of environmental noises in the course of conversation.

Figure 3A:
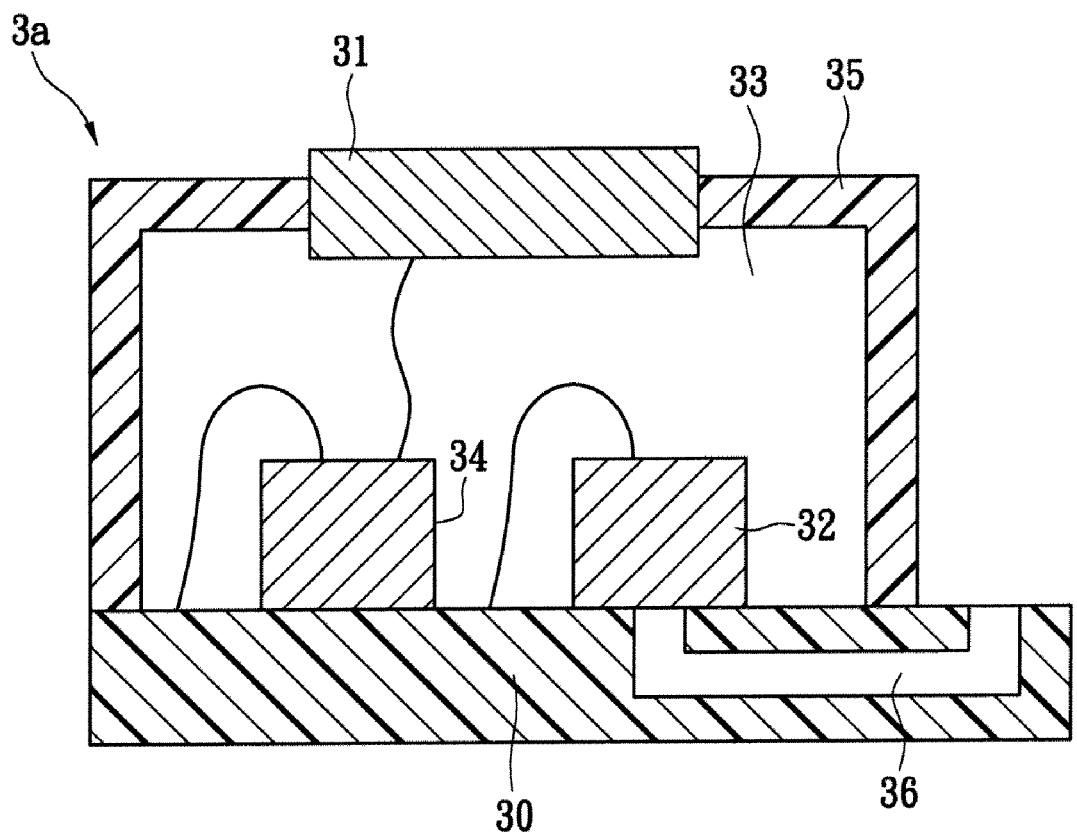
FIG. 3A shows a cross-sectional view of a MEMS microphone for the second embodiment of the instant disclosure.

Refer subsequently to FIG. 3A, wherein a cross-sectional view of a MEMS microphone 3a for the second embodiment of the instant disclosure is shown. The MEMS microphone 3a depicted in FIG. 3A comprises a cover 35, a base 30, a first MEMS chip 32, and a second MEMS chip 34.

A contact voice receiving unit 31 is disposed on the cover 35 for making physical contact. The top side of the base 30 is connected to the cover 35 such that a space 33 is formed between the base 30 and the cover 35. In addition, the base 30 has a voice receiving channel 36, where a first end of the voice receiving channel 36 is connected to the space 33, while a second end of the voice receiving channel 36 is open to the ambient. The first MEMS chip 32 and the second MEMS chip 34 are both disposed within the space 33, in which the first MEMS chip 32 is electrically connected to the base 30 in corresponding to the first end of the voice receiving channel 36. The second MEMS chip 34 is electrically connected to the base 30 and the contact voice receiving unit 31.

Refer again to FIG. 3A. The connection of the base 30 and the cover 35 can be done by using an adhesive to bond the cover 35 onto the base 30 along the outer periphery of the base 30, to encapsulate the first MEMS chip 32 and the second MEMS chip 34 within the space 33.

In the present embodiment, external voices can enter into the space 33 through the voice receiving channel 36 and, at the same time, the first MEMS chip 32 can receive the voice entering into the space 33. A passive component (not shown) is installed inside the first MEMS chip 32, thereby converting the voice transferred to the first MEMS chip 32 into a first electronic signal and then passing the first electronic signal out via the base 30.

Additionally, in the present embodiment, the contact voice receiving unit 31 is a voice receiving membrane which is used to contact human skin as well as to sense and receive by way of human skin the vibration signal generated as the person speaks, and then take and transfer the received vibration signal to the second MEMS chip 34. The MEMS chip 34 then converts the vibration signal into a second electronic signal and sends out the second electronic signal through the base 30.

Furthermore, the base 30 in the MEMS microphone 3a according to the present embodiment can further receive a control signal from an operating system (not shown). The control signal can be sent to the first MEMS chip 32 and the second MEMS chip 34 for enabling or disabling the operations in the first MEMS chip 32 and the second MEMS chip 34.

In summary, the MEMS microphone 3a according to the present embodiment is allowed to use the first MEMS chip 32 to pick up a user's voices in a first voice receiving mode, or else use the second MEMS chip 34 to take a user's voices by way of user's skin in a second voice receiving mode; or otherwise activating both the first and the second voice receiving modes to enhance the capability in voice reception. Thus, in the user's dialog, it is possible to select the desired voice receiving mode according to actual requirements in terms of the communication environment, thereby preventing interferences from ambient noises.

Figure 3B:
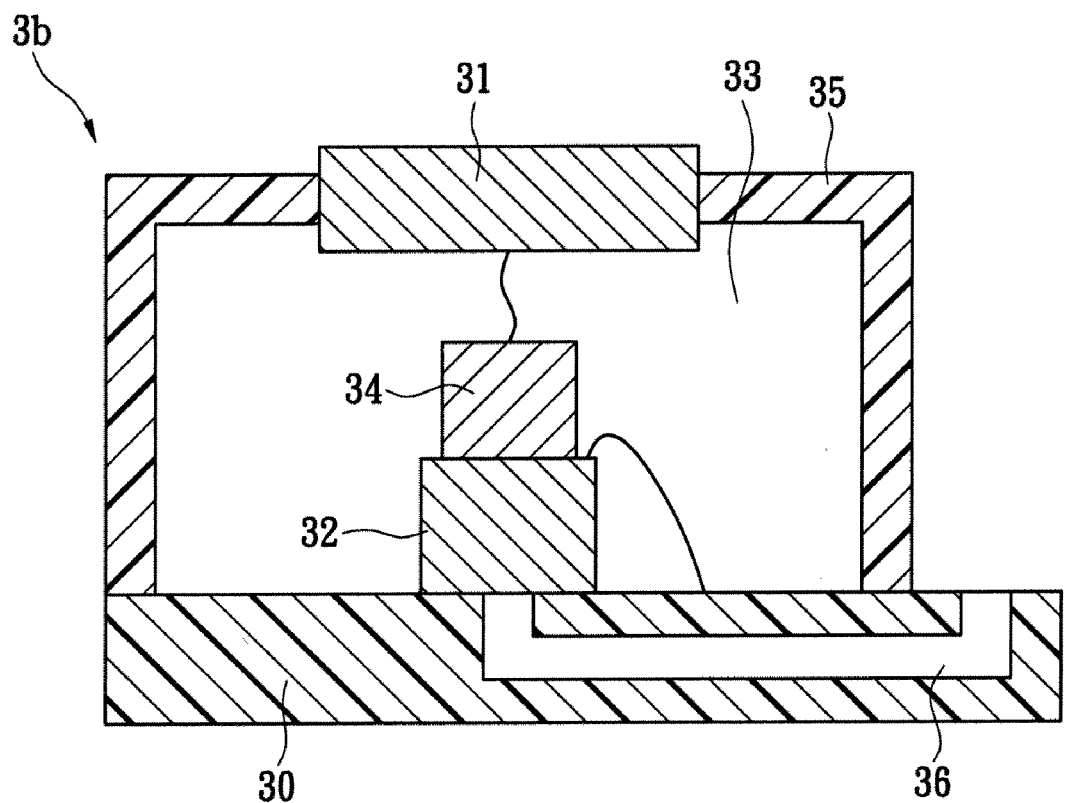
FIG. 3B shows a cross-sectional view of a MEMS microphone for the third embodiment of the instant disclosure.

In conjunction with FIG. 3A, refer next to FIG. 3B, wherein a cross-sectional view of a MEMS microphone 3b for the third embodiment of the instant disclosure is shown. The elements in the MEMS microphone 3b of the third embodiment are identical to the ones illustrated in the second embodiment, therefore are specified with the same reference numbers. The structure, operation principle, and achieved effects of the MEMS microphone 3b are essentially equivalent to the second embodiment, with the difference lying in that: the second MEMS chip 34 in the MEMS microphone 3b is disposed onto the first MEMS chip 32 using the flip chip method and electrically connected to the first MEMS chip 32 and the contact voice receiving unit 31.

Figure 3C:
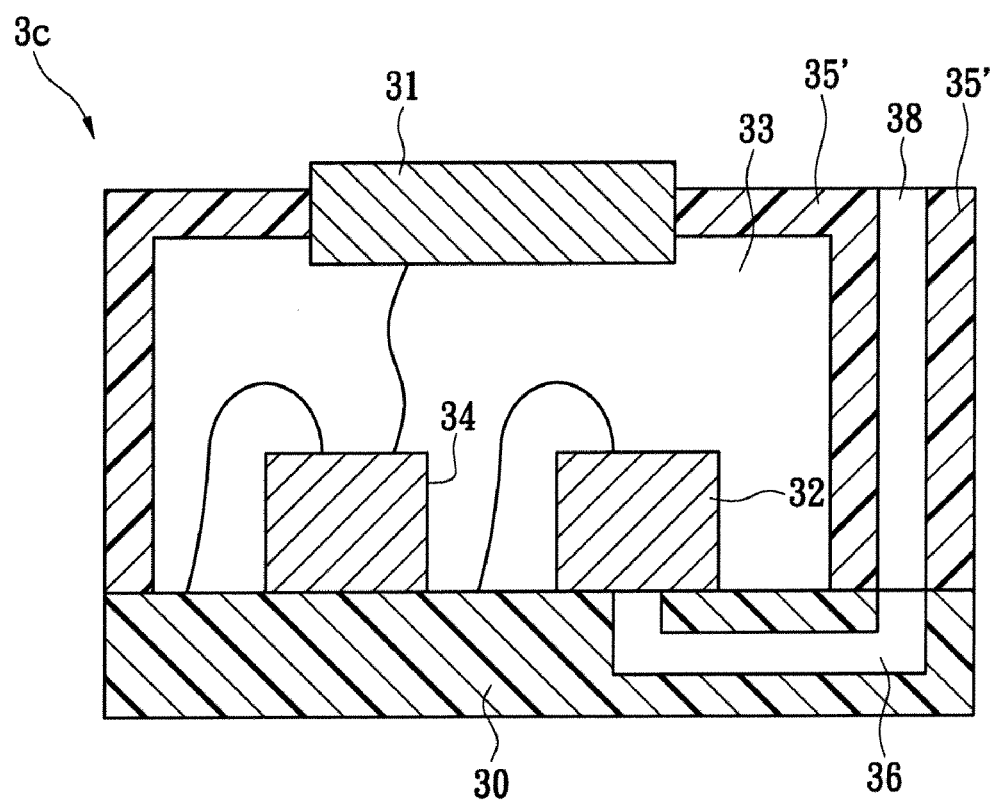
FIG. 3C shows a cross-sectional view of a MEMS microphone for the fourth embodiment of the instant disclosure.

In conjunction with FIG. 3A, refer next to FIG. 3C, wherein a cross-sectional view of a MEMS microphone 3c for the fourth embodiment of the instant disclosure is shown. The elements in the MEMS microphone 3c of the fourth embodiment are identical to the ones illustrated in the second embodiment, thereby are specified with the same reference numbers. The structure, operation principle, and achieved effects of the MEMS microphone 3c are essentially equivalent to the second embodiment, with the difference lying in that: the cover 35' further has a voice hole 38, in which the voice hole 38 connects the second end of the voice receiving channel 36 to the exterior, and the first end of the voice receiving channel 36 is connected to the space 33. Hence, ambient voices can enter into the space 33 from the voice hole 38 and through the voice receiving channel 36 in the base 30; herein, the first MEMS chip 32 can receive the voice entering into the space 33 and perform relevant processes.

Figure 3D:
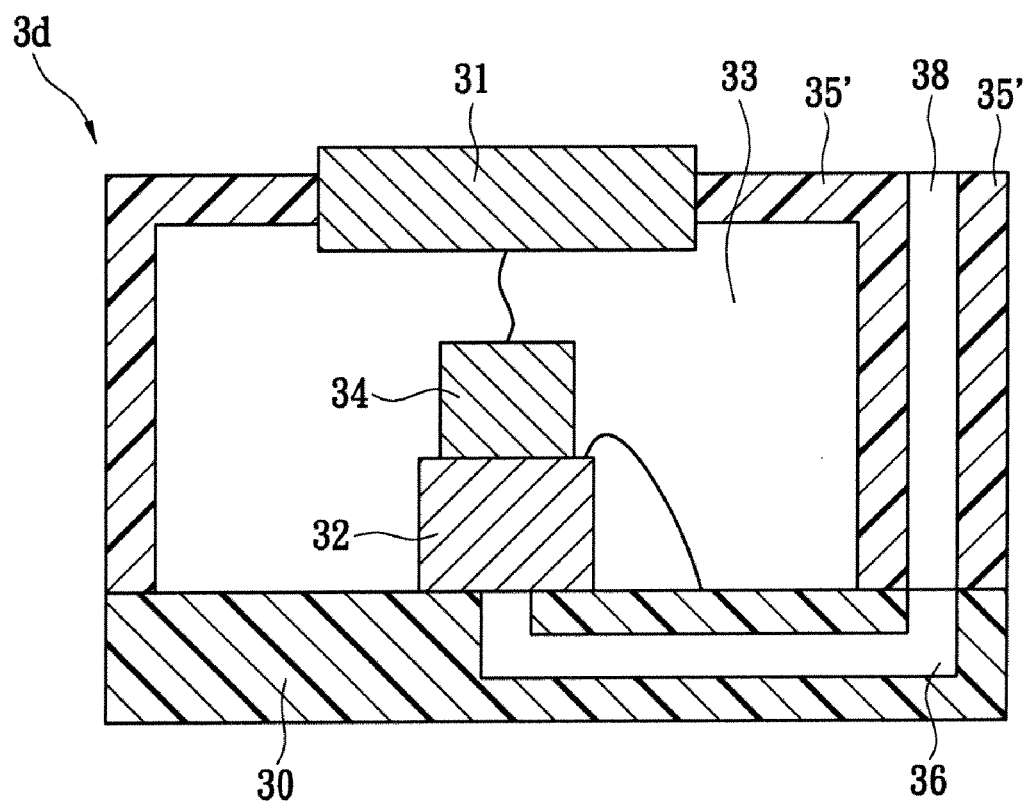
FIG. 3D shows a cross-sectional view of a MEMS microphone for the fifth embodiment of the instant disclosure.

In conjunction with FIG. 3C, refer next to FIG. 3D, wherein a cross-sectional view of a MEMS microphone 3d for the fifth embodiment of the instant disclosure is shown. The elements in the MEMS microphone 3d of the fifth embodiment are identical to the ones illustrated in the fourth embodiment, thereby are specified with the same reference numbers. The structure, operation principle, and achieved effects of the MEMS microphone 3d are essentially equivalent to the fourth embodiment, with the difference lying in that: the second MEMS chip 34 in the MEMS microphone 3d is disposed onto the first MEMS chip 32 by the flip chip method and electrically connected to the first MEMS chip 32 and the contact voice receiving unit 31.

In summary, the MEMS microphone according to the embodiments of the instant disclosure applies a contact voice receiving unit for external contacts (e.g., for user's skin contact). Therefore, the MEMS microphone in the respective embodiment takes the vibration signal generated on user's skin as the user speaks, converts the vibration signal into the electronic signal by means of the MEMS chip and then sends out the electronic signal through the base, thereby accurately transferring the user's voices and dialogs to the receiving party without interferences caused by ambient noises.

Additionally, the MEMS microphone according to the embodiments of the instant disclosure can also receive the user's voice without skin contact in a first voice receiving mode or alternatively to receive the user's voice by way of the user's skin in a second voice receiving mode. Furthermore, the MEMS microphone according to the embodiments of the instant disclosure can further simultaneously activate both the first and the second voice receiving modes so as to enhance the capability in voice reception; consequently, for the user's dialog, it is possible to select the desired voice receiving mode according to actual requirements in terms of the communication environment, thereby preventing interferences from ambient noises.

However, the descriptions illustrated supra set forth simply the preferred embodiments of the instant disclosure; the characteristics of the instant disclosure are by no means restricted thereto. All changes, alternations, or modifications conveniently considered by those skilled ones in the art are deemed to be encompassed within the scope of the instant disclosure delineated by the following claims.

What is claimed is:

1. A MEMS microphone, comprising:
   a cover, which has a contact voice receiving unit allowed for external bodily contact;
   a base having a voice receiving channel in which one end of the voice receiving channel is connected to a space formed by the cover disposed over the base, while the second end thereof is open to the ambient;
   a first MEMS chip, which is disposed in the space and electrically connected to the base in correspondence with the first end of the voice receiving channel; and
   a second MEMS chip, which is disposed in the space and electrically connected to the base and the contact voice receiving unit.

2. The MEMS microphone of claim 1, wherein the cover further has a voice hole, and the voice hole is connected to the second end of the voice receiving channel and the exterior.

3. The MEMS microphone of claim 1, wherein the first MEMS chip receives the external voice through the voice receiving channel, converts the external voice into a first electronic signal and then sends out through the base.

4. The MEMS microphone of claim 1, wherein the contact voice receiving unit is a voice receiving membrane which takes a vibration signal through human skin.

5. The MEMS microphone of claim 4, wherein the second MEMS chip converts the vibration signal into a second electronic signal and sends out through the base.

6. The MEMS microphone of claim 1, wherein the first MEMS chip and the second MEMS chip both receive a control signal through the base and are controlled by the control signal.

7. A MEMS microphone, comprising:
   a cover, which has a contact voice receiving unit allowed for external bodily contact;
   a base having a voice receiving channel in which one end of the voice receiving channel is connected to a space formed by the cover disposed over the base, while the second end thereof is open to the ambient;
   a first MEMS chip, which is disposed in the space and electrically connected to the base in correspondence with the first end of the voice receiving channel; and
   a second MEMS chip, which is disposed on the first MEMS chip by the flip chip method and electrically connected to the first MEMS chip and the contact voice receiving unit.

8. The MEMS microphone of claim 7, wherein the cover further has a voice hole, and the voice hole is connected to the second end of the voice receiving channel and the exterior.

9. The MEMS microphone of claim 7, wherein the first MEMS chip receives the external voice through the voice receiving channel, converts the external voice into a first electronic signal and then sends out through the base.

10. The MEMS microphone of claim 7, wherein the contact voice receiving unit is a voice receiving membrane which takes a vibration signal through human skin.

11. The MEMS microphone of claim 10, wherein the second MEMS chip converts the vibration signal into a second electronic signal and sends out through the base.

12. The MEMS microphone of claim 7, wherein the first MEMS chip and the second MEMS chip both receive a control signal through the base and are controlled by the control signal.

* * * * *